(12) United States Patent
Janisch et al.

(10) Patent No.: US 10,957,563 B2
(45) Date of Patent: Mar. 23, 2021

(54) CHAMBER WALL HEATING FOR A MILLISECOND ANNEAL SYSTEM

(71) Applicants: Mattson Technology, Inc., Fremont, CA (US); Beijing E-Town Semiconductor Technology Co., Ltd., Beijing (CN)

(72) Inventors: Joachim Janisch, Roggenburg (DE); Manuel Mueller, Neu-Ulm (DE)

(73) Assignees: Mattson Technology, Inc., Fremont, CA (US); Beijing E-Town Semiconductor Technology Co., Ltd., Beijing (CN)

(*) Notice: Subject to any disclaimer, the term of this patent is extended or adjusted under 35 U.S.C. 154(b) by 118 days.

(21) Appl. No.: 15/380,191

(22) Filed: Dec. 15, 2016

(65) Prior Publication Data

US 2017/0194175 A1 Jul. 6, 2017

Related U.S. Application Data

(60) Provisional application No. 62/272,915, filed on Dec. 30, 2015.

(51) Int. Cl.
| | |
|---|---|
| *H01L 21/67* | (2006.01) |
| *F27D 25/00* | (2010.01) |
| *H05B 3/00* | (2006.01) |

(52) U.S. Cl.
CPC ........ *H01L 21/67248* (2013.01); *F27D 25/00* (2013.01); *H01L 21/6719* (2013.01); *H01L 21/67109* (2013.01); *H01L 21/67115* (2013.01); *H05B 3/0047* (2013.01)

(58) Field of Classification Search
USPC ............................................................ 432/2
See application file for complete search history.

(56) References Cited

U.S. PATENT DOCUMENTS

| | | | |
|---|---|---|---|
| 6,204,203 B1 | 3/2001 | Narwankar et al. | |
| 6,748,334 B1* | 6/2004 | Perez ................. | G01N 21/3504 |
| | | | 702/24 |
| 7,442,415 B2 | 10/2008 | Conley, Jr. et al. | |
| 7,641,349 B1* | 1/2010 | Chrobak .............. | G02B 5/0891 |
| | | | 359/845 |

(Continued)

FOREIGN PATENT DOCUMENTS

WO WO 2010-088338 8/2010

OTHER PUBLICATIONS

Ragnarsson et al., "The Importance of Moisture Control for EOT Scaling of Hf-Based Dielectrics," *Journal of the Electrochemical Society*, vol. 156, Issue 6, Apr. 3, 2009, pp. H416-H423.

(Continued)

*Primary Examiner* — Steven B McAllister
*Assistant Examiner* — John E Bargero
(74) *Attorney, Agent, or Firm* — Dority & Manning, P.A.

(57) ABSTRACT

Systems and methods for reducing contamination on reflective mirrors disposed on chamber walls in a millisecond anneal system are provided. In one example implementation, the reflective mirrors can be heated by one or more of (1) heating the fluid in the closed fluid system for regulating the temperature of the reflective mirrors; (2) electrical cartridge heater(s) or heater ribbon(s) attached to the reflective mirrors; and/or (3) use of lamp light inside the chamber.

15 Claims, 12 Drawing Sheets

(56) References Cited

U.S. PATENT DOCUMENTS

| | | | |
|---|---|---|---|
| 7,790,633 | B1 | 9/2010 | Tarafdar et al. |
| 8,323,754 | B2 | 12/2012 | Olsen et al. |
| 8,809,175 | B2 | 8/2014 | Tsai et al. |
| 9,093,468 | B2 | 7/2015 | Tsai et al. |
| 2003/0132213 | A1 | 7/2003 | Kim et al. |
| 2004/0058560 | A1 | 3/2004 | Ranish et al. |
| 2005/0023267 | A1* | 2/2005 | Timans ............... F27B 17/0025 219/405 |
| 2009/0208880 | A1* | 8/2009 | Nemani ................ G03F 7/0757 430/323 |
| 2013/0178072 | A1 | 7/2013 | Ramachandran et al. |
| 2015/0140838 | A1 | 5/2015 | Kashefi et al. |
| 2015/0155190 | A1 | 6/2015 | Miller et al. |

OTHER PUBLICATIONS

Ferrari et al., "Diffusion Reaction of Oxygen in HfO2/SiO2/Si Stacks," *The Journal of Physical Chemistry B*, vol. 110, No. 30, Jul. 12, 2006, pp. 14905-14910.

Driemeier et al., "Thermochemical behavior of hydrogen in hafnium silicate films on Si," Applied Physics Letters, vol. 89, Issue 5, Aug. 2006,—4 pages.

Driemeier et al., "Room temperature interactions of water vapor with Hf O2 films on Si," Applied Physics Letters, vol. 88, Issue 20, May 2006—3 pages.

Conley, Jr. et al., "Densification and improved electrical properties of pulse-deposited films via in situ modulated temperature annealing," *Applied Physics Letters*, vol. 84, Issue 11, Mar. 15, 2004, pp. 1913-1915.

Nakajima et al., "Experimental Demonstration of Higher-k phase HfO2 through Non-equilibrium Thermal Treatment," ECS Transactions 28.2 (2010), pp. 203-212.

Wu et al., "Device Performance and Reliability Improvement for MOSFETs With HfO2 Gate Dielectrics Fabricated Using Multideposition Room-Temperature Multiannealing," IEEE Electron Device Letters, vol. 32, Issue 9, Sep. 2011, pp. 1173-1175.

PCT International Search Report for corresponding PCT Application No. PCT/US2016/066878, dated Apr. 10, 2017—3 pages.

PCT International Preliminary Report on Patentability for corresponding PCT Application No. PCT/US2016/066878, dated Jul. 12, 2018—15 pages.

\* cited by examiner

CHAMBER WALL HEATING FOR A MILLISECOND ANNEAL SYSTEM

PRIORITY CLAIM

The present application claims the benefit of priority of U.S. Provisional Application Ser. No. 62/272,915, filed on Dec. 30, 2015, entitled "Chamber Wall Heating for a Millisecond Anneal System," which is incorporated herein by reference.

FIELD

The present disclosure relates generally to thermal processing chambers and more particularly to millisecond anneal thermal processing chambers used for processing, for instance, semiconductor substrates.

BACKGROUND

Millisecond anneal systems can be used for semiconductor processing for the ultra-fast heat treatment of substrates, such as silicon wafers. In semiconductor processing, fast heat treatment can be used as an anneal step to repair implant damage, improve the quality of deposited layers, improve the quality of layer interfaces, to activate dopants, and to achieve other purposes, while at the same time controlling the diffusion of dopant species.

Millisecond, or ultra-fast, temperature treatment of semiconductor substrates can be achieved using an intense and brief exposure of light to heat the entire top surface of the substrate at rates that can exceed $10^{4\circ}$ C. per second. The rapid heating of just one surface of the substrate can produce a large temperature gradient through the thickness of the substrate, while the bulk of the substrate maintains the temperature before the light exposure. The bulk of the substrate therefore acts as a heat sink resulting in fast cooling rates of the top surface.

SUMMARY

Aspects and advantages of embodiments of the present disclosure will be set forth in part in the following description, or may be learned from the description, or may be learned through practice of the embodiments.

One example aspect of the present disclosure is directed to a millisecond anneal system. The millisecond anneal system includes a processing chamber having a chamber wall. The chamber wall includes a reflective mirror. The system includes a fluid cooling system configured to flow fluid into the reflective mirror. The system further includes a heating system configured to heat the reflective mirror to reduce contamination of the reflective mirror during millisecond anneal processing.

Another example aspect of the present disclosure is directed to a process for reducing contamination on a reflective mirror disposed on a chamber wall in a millisecond anneal system. The process includes: flowing a fluid through a reflective mirror disposed on a chamber wall in a millisecond anneal system; determining a temperature associated with one or more of the reflective mirror or the fluid; and adjusting one or more characteristics of the fluid flowing through the reflective mirror based at least in part on the temperature to achieve a reflective mirror temperature sufficient to reduce contamination of the reflective mirror during millisecond anneal processing.

Variations and modification can be made to the example aspects of the present disclosure. Other example aspects of the present disclosure are directed to systems, methods, devices, and processes for thermally treating a semiconductor substrate.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
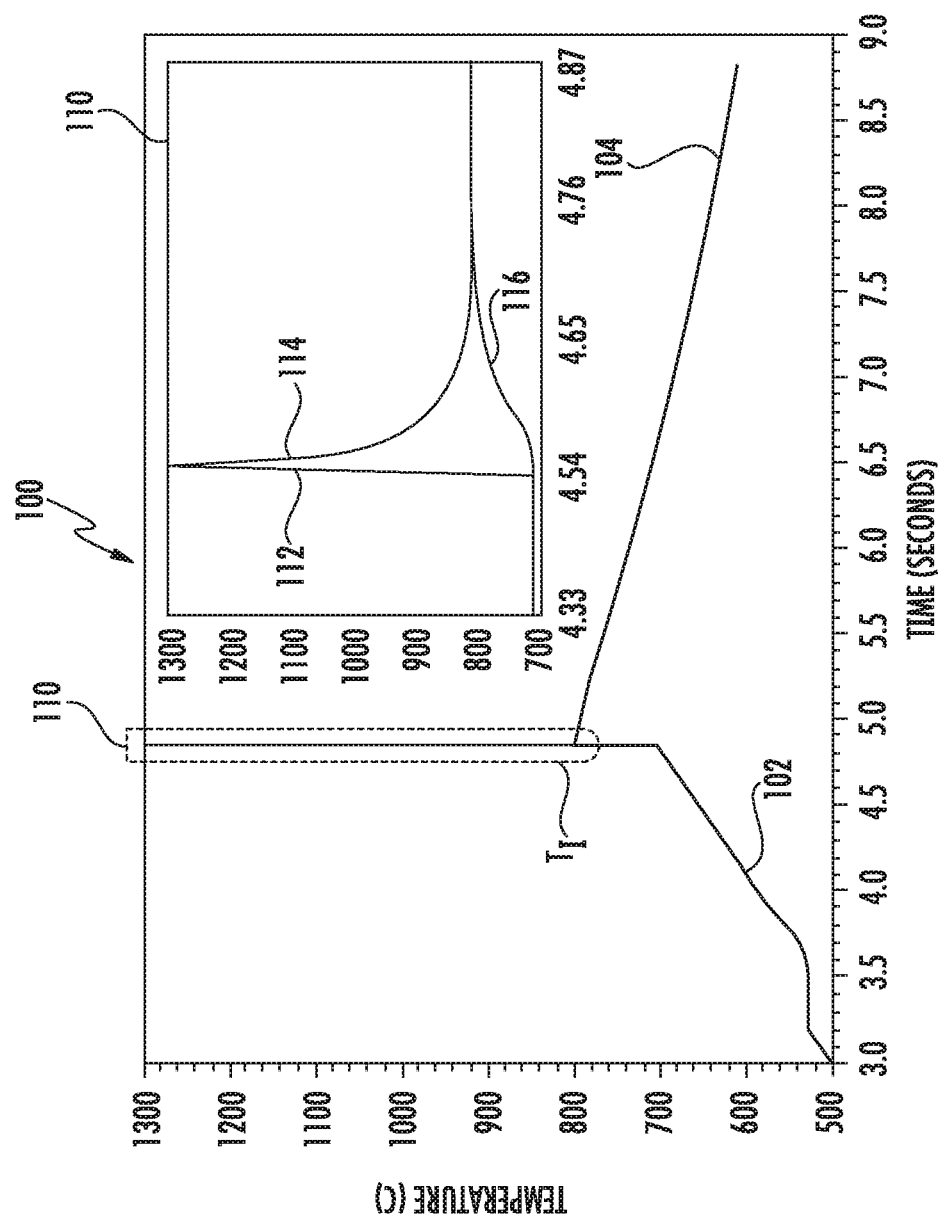
FIG. 1 depicts an example millisecond heating profile according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Overview

Example aspects of the present disclosure are directed to reducing gaseous contaminants on chamber walls of a process chamber of a millisecond anneal system. Aspects of the present disclosure are discussed with reference to a "wafer" or semiconductor wafer for purposes of illustration and discussion. Those of ordinary skill in the art, using the disclosures provided herein, will understand that the example aspects of the present disclosure can be used in association with any workpiece, semiconductor substrate or other suitable substrate. The use of the term "about" in conjunction with a numerical value refers to within 10% of the stated numerical value.

Millisecond, or ultra-fast, thermal treatment of semiconductor wafers can be achieved using an intense and brief exposure of light (e.g., a "flash") to heat the entire top surface of the wafer at rates that can exceed $10^{4\circ}$ C. per second. A typical heat treatment cycle can include: (a) loading a cold semiconductor substrate into the chamber; (b) purging the chamber with, for instance, nitrogen gas (atmospheric pressure); (c) heating the semiconductor substrate to an intermediate temperature Ti; (d) millisecond heating by flash exposure of the top surface of the semiconductor substrate, while the bulk of the wafer remains at $T_i$; (e) rapid cool down by conductive cooling of the top surface of the semiconductor substrate with the bulk of the semiconductor substrate being the conductively coupled heat sink; (f) slow cool down of the bulk of the semiconductor substrate by thermal radiation and convection, with the process gas at atmospheric pressure as cooling agent; and (g) transport the semiconductor substrate back to the cassette.

Figure 14:
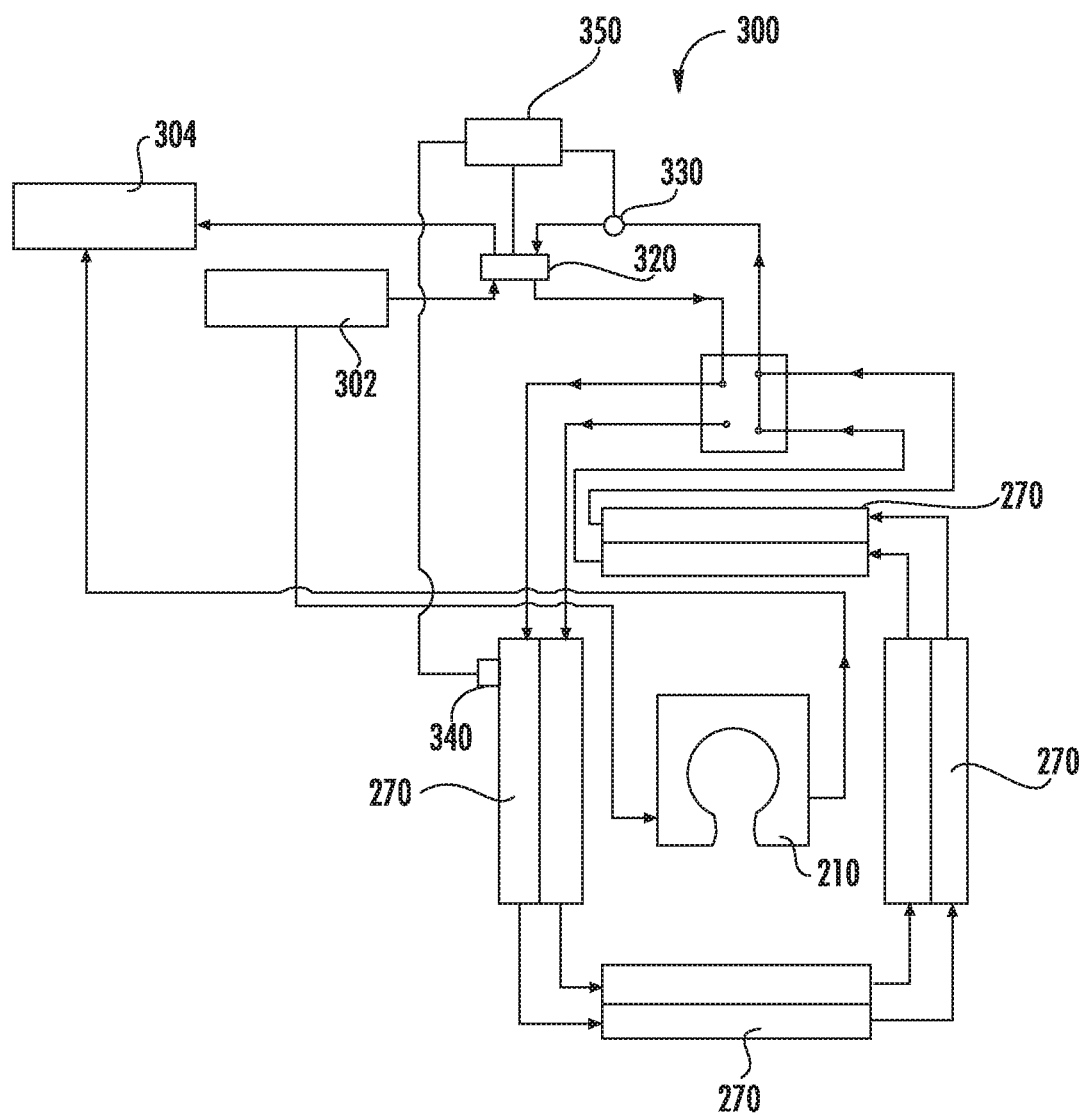
FIG. 14 depicts an example closed loop water circuit having a heater in a millisecond anneal system according to example embodiments of the present disclosure.

A processing chamber in a millisecond anneal system can be divided by a wafer plane plate into two sub-chambers: a top chamber and a bottom chamber. The walls of each of the sub-chambers can include reflector mirrors on four sides. These reflector mirrors can be fluid cooled (e.g., water cooled) by way of internal channels. Typically, the fluid temperature is about 15° C. to about 23° C. Each reflector mirror can have its own fluid inlet and outlet connection. The fluid supply scheme can be such that a main supply manifold supplies the wafer plane plate and the mirror manifold. The mirror manifold can then supply the bottom chamber parts and the top chamber reflective mirrors. In other words, the bottom chamber parts, the top chamber parts, and the wafer plane plate can be connected in parallel, whereas the four reflector mirrors of each sub-chamber can be connected in series. The water return connection layout can be accomplished in the same manner. FIG. 14 depicts an example closed loop fluid circuit in a millisecond anneal system according to example embodiments of the present disclosure.

During heat treatment, gaseous contaminants can evaporate from the surface of the substrate. The contaminants can be deposited on chamber parts. Typically, the deposition rate is higher on colder surfaces. The contamination of the reflector mirrors can negatively impact the irradiance of the substrate, and, as a result, the substrate temperature uniformity. As the reflective mirrors get coated, the temperature uniformity degrades, requiring frequent mechanical cleaning maintenance to restore the original temperature uniformity. In some cases the contamination can be removed by heating the chamber in an oxygen rich atmosphere. However this can lower the overall throughput metric of the system, as during the oxygen clean time device substrates may not be processed.

According to example embodiments of the present disclosure, the deposition of gaseous contamination products on the reflective mirrors can be reduced by heating the reflective mirror to temperatures greater than about 100° C., such as about 150° C. In some embodiments, the reflective mirrors can be heated by one or more of (1) heating the fluid in the closed fluid system for regulating the temperature of the reflective mirrors; (2) electrical cartridge heater(s) or heater ribbon(s) attached to the reflective mirrors; and/or (3) use of lamp light inside the chamber.

For instance, one example embodiment is directed to a millisecond anneal system. The system includes a processing chamber having a chamber wall. The chamber wall includes a reflective mirror. The system includes a fluid cooling system configured to flow fluid into the reflective mirror. The system further includes a heating system configured to heat the reflective mirror to reduce contamination of the reflective mirror during millisecond anneal processing. For instance, in some embodiments, the heating system is configured to heat the reflective mirror to a temperature of 100° C. or greater, such as about 150° C.

In some embodiments, the heating system is configured to heat the fluid flowing into the reflective mirror by the fluid cooling system. For instance, the heating system can include a heater configured to heat fluid flowing in a supply line configured to supply fluid to the reflective mirror. The heater can also be configured to heat fluid flowing in a fluid return line configured to receive fluid from the reflective mirror. The heating system can include one or more control devices configured to control operation of the heater. The one or more control devices can be configured to control operation of the heater based on data indicative of fluid temperature and/or data indicative of a temperature of the reflective mirror.

In some embodiments, the heating system includes an electrical heater in thermal communication with the reflective mirror. The electrical heater can include one or more of a heater ribbon or a heater cartridge. The heating system can include a temperature sensor configured to measure a temperature of the reflective mirror and one or more control devices configured to control an electrical current through the electrical heater coupled to the reflective mirror based at least in part on the temperature of the reflective mirror.

In some embodiments, the heating system includes one or more control devices. The one or more control devices are configured to control the flow of fluid (e.g., through one or more control valves) through the fluid cooling system based at least in part on a temperature of the reflective mirror.

Another example embodiment of the present disclosure is directed to a process for reducing contamination on a reflective mirror disposed on a chamber wall in a millisecond anneal system. The process can include flowing a fluid through a reflective mirror disposed on a chamber wall in a millisecond anneal system. The process can include determining a temperature associated with one or more of the reflective mirror or the fluid. The process can include adjusting one or more characteristics of the fluid flowing through the reflective mirror based at least in part on the temperature to achieve a reflective mirror temperature sufficient to reduce contamination of the reflective mirror during millisecond anneal processing (e.g., a temperature of 100° C. or greater, such as about 150° C.).

In some embodiments, adjusting one or more characteristics of the fluid flowing through the reflective mirror includes heating the fluid flowing through the reflective mirror. The fluid can be heated using a heater configured to heat fluid flowing in a fluid supply line and/or a fluid return line associated with the reflective mirror.

In some embodiments, adjusting one or more characteristics of the fluid flowing through the reflective mirror includes adjusting a flow of the fluid through the reflective mirror. For instance, adjusting the flow of fluid can include switching on the flow of fluid when the temperature associated with the reflective mirror is greater than an upper threshold and switching off the flow of fluid when the temperature associated with the reflective mirror is less than a lower threshold.

Example Millisecond Anneal Systems

An example millisecond anneal system can be configured to provide an intense and brief exposure of light to heat the top surface of a wafer at rates that can exceed, for instance, about $10^{4°}$ C./s. FIG. 1 depicts an example temperature profile 100 of a semiconductor substrate achieved using a millisecond anneal system. As shown in FIG. 1, the bulk of the semiconductor substrate (e.g., a silicon wafer) is heated to an intermediate temperature $T_i$ during a ramp phase 102. The intermediate temperature can be in the range of about 450° C. to about 900° C. When the intermediate temperature $T_i$ is reached, the top side of the semiconductor substrate can be exposed to a very short, intense flash of light resulting in heating rates of up to about $10^{4°}$ C./s. Window 110 illustrates the temperature profile of the semiconductor substrate during the short, intense flash of light. Curve 112 represents the rapid heating of the top surface of the semiconductor substrate during the flash exposure. Curve 116 depicts the temperature of the remainder or bulk of the semiconductor substrate during the flash exposure. Curve 114 represents the rapid cool down by conductive of cooling of the top surface of the semiconductor substrate by the bulk of the semiconductor substrate acting as a heat sink. The bulk of the semiconductor substrate acts as a heat sink generating high top side cooling rates for the substrate. Curve 104 represents the slow cool down of the bulk of the semiconductor substrate by thermal radiation and convection, with a process gas as a cooling agent. As used herein, the term "about" when used in reference to a numerical value refers to within 30% of the stated numerical value.

An example millisecond anneal system can include a plurality of arc lamps (e.g., four Argon arc lamps) as light sources for intense millisecond long exposure of the top surface of the semiconductor substrate—the so called "flash." The flash can be applied to the semiconductor substrate when the substrate has been heated to an intermediate temperature (e.g., about 450° C. to about 900° C.). A plurality of continuous mode arc lamps (e.g., two Argon arc lamps) can be used to heat the semiconductor substrate to the intermediate temperature. In some embodiments, the heating of the semiconductor substrate to the intermediate temperature is accomplished through the bottom surface of the semiconductor substrate at a ramp rate which heats the entire bulk of the wafer.

Figure 2:
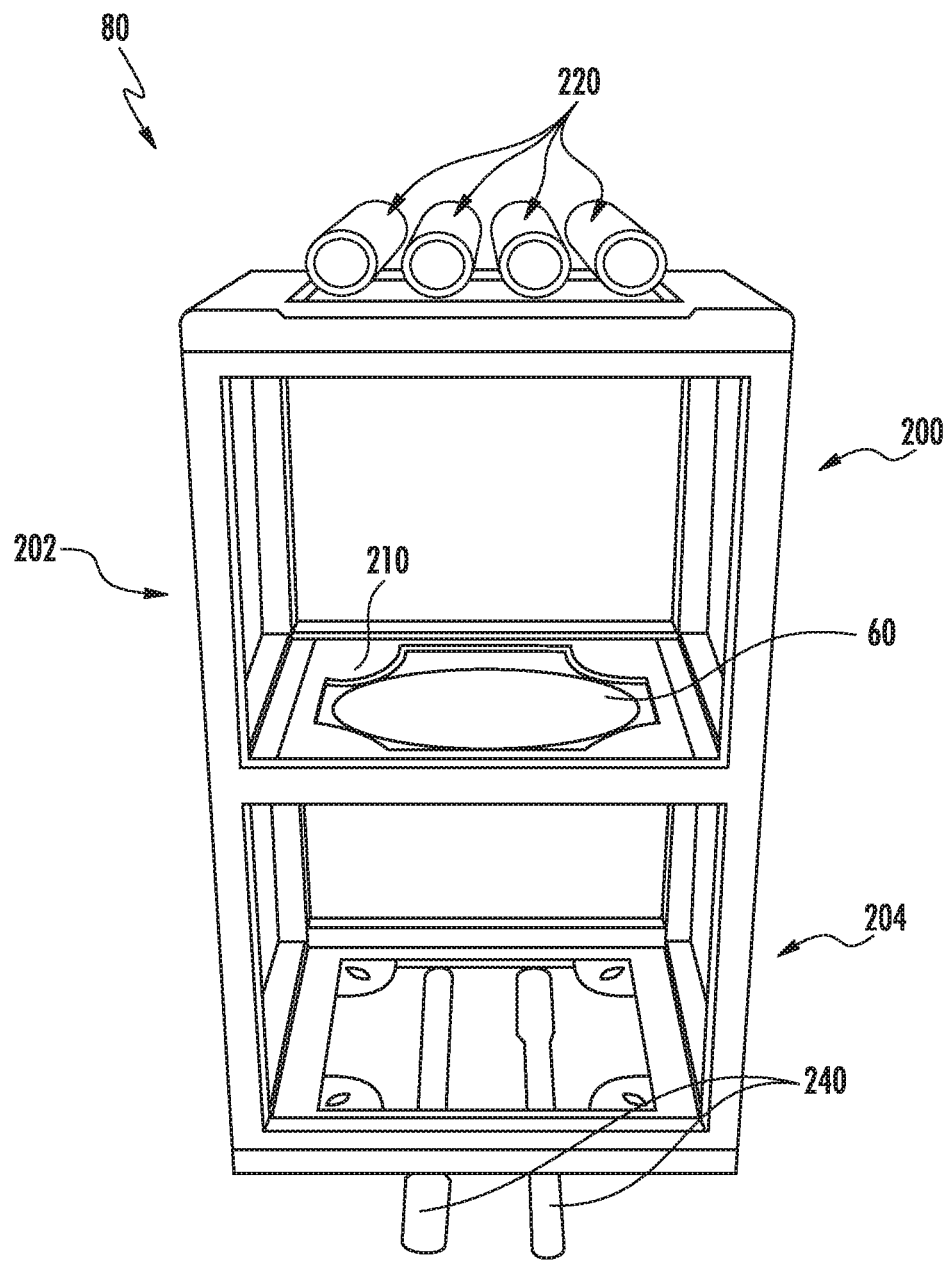
FIG. 2 depicts an example temperature measurement system for a millisecond anneal system according to example embodiments of the present disclosure.
Figure 3:
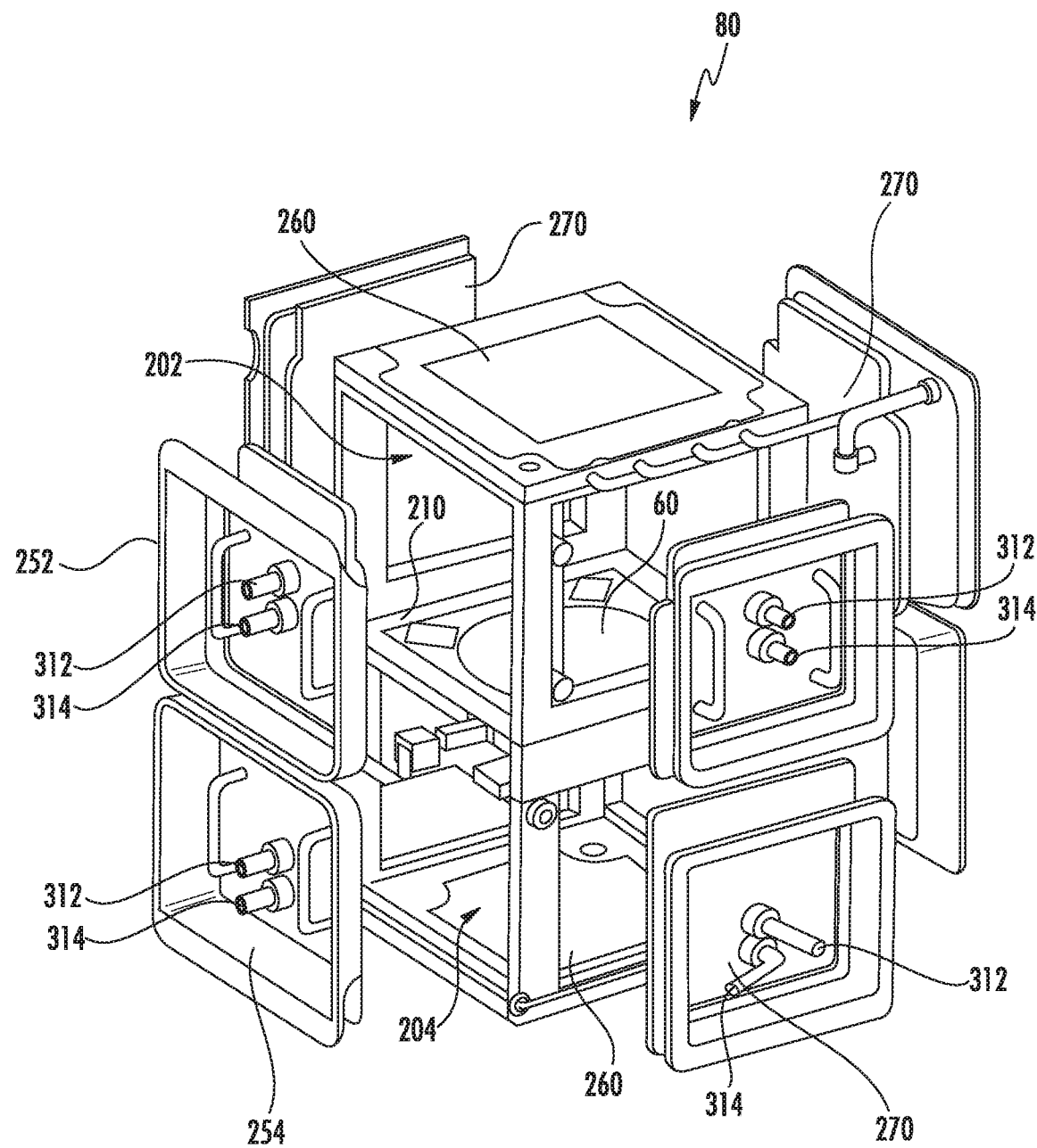
FIG. 3 depicts an example perspective view of a portion of an example millisecond anneal system according to example embodiments of the present disclosure.
Figure 4:
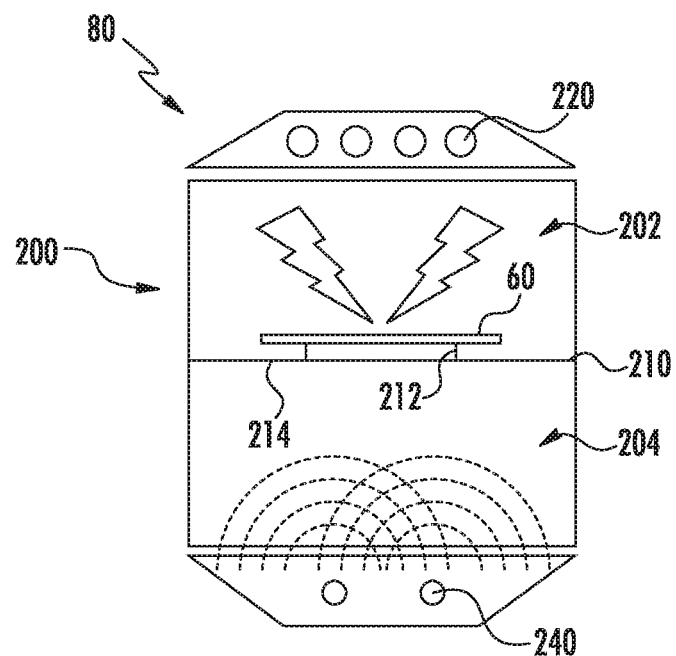
FIG. 4 depicts an exploded view of an example millisecond anneal system according to example embodiments of the present disclosure.

FIGS. 2 to 5 depict various aspects of an example millisecond anneal system 80 according to example embodiments of the present disclosure. As shown in FIGS. 2-4, a millisecond anneal system 80 can include a process chamber 200. The process chamber 200 can be divided by a wafer plane plate 210 into a top chamber 202 and a bottom chamber 204. A semiconductor substrate 60 (e.g., a silicon wafer) can be supported by support pins 212 (e.g., quartz support pins) mounted to a wafer support plate 214 (e.g., quartz glass plate inserted into the wafer plane plate 210).

As shown in FIGS. 2 and 4, the millisecond anneal system 80 can include a plurality of arc lamps 220 (e.g., four Argon arc lamps) arranged proximate the top chamber 202 as light sources for intense millisecond long exposure of the top surface of the semiconductor substrate 60—the so called "flash." The flash can be applied to the semiconductor substrate when the substrate has been heated to an intermediate temperature (e.g., about 450° C. to about 900° C.).

A plurality of continuous mode arc lamps 240 (e.g., two Argon arc lamps) located proximate the bottom chamber 204 can be used to heat the semiconductor substrate 60 to the intermediate temperature. In some embodiments, the heating of the semiconductor substrate 60 to the intermediate temperature is accomplished from the bottom chamber 204 through the bottom surface of the semiconductor substrate at a ramp rate which heats the entire bulk of the semiconductor substrate 60.

As shown in FIG. 3, the light to heat the semiconductor substrate 60 from the bottom arc lamps 240 (e.g., for use in heating the semiconductor substrate to an intermediate temperature) and from the top arc lamps 220 (e.g., for use in providing millisecond heating by flash) can enter the processing chamber 200 through water windows 260 (e.g., water cooled quartz glass windows). In some embodiments, the water windows 260 can include a sandwich of two quartz glass panes between which an about a 4 mm thick layer of water is circulating to cool the quartz panes and to provide an optical filter for wavelengths, for instance, above about 1400 nm.

Figure 5:
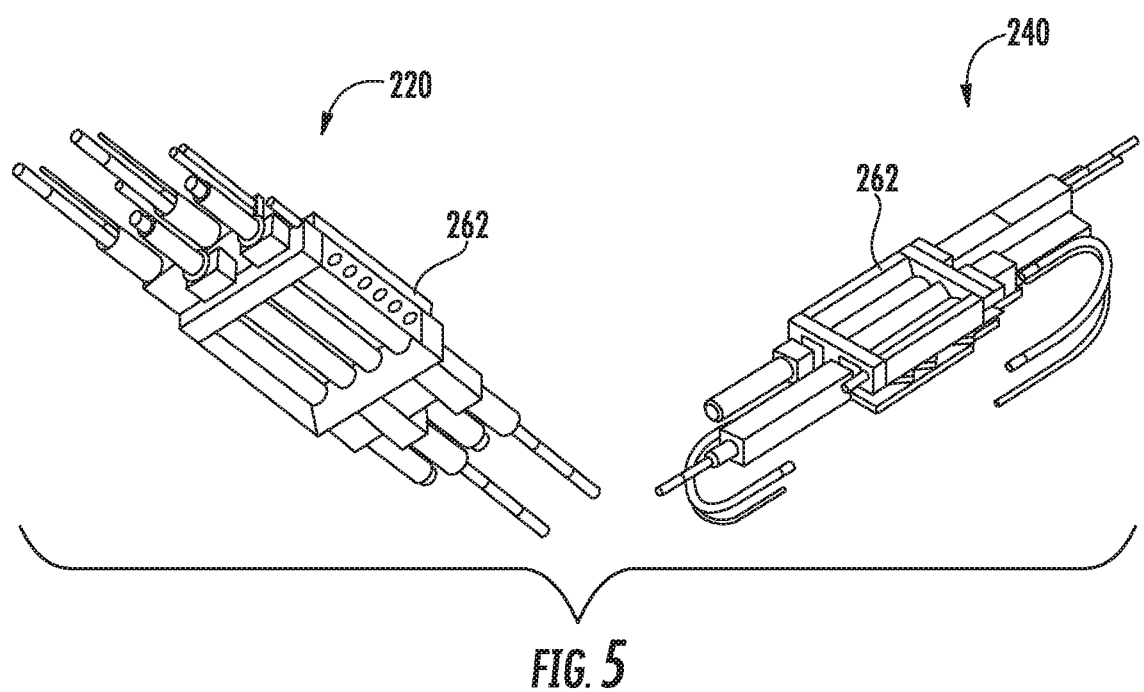
FIG. 5 depicts a cross-sectional view of an example millisecond anneal system according to example embodiments of the present disclosure.

As further illustrated in FIG. 3, process chamber walls 250 can include reflective mirrors 270 for reflecting the heating light. The reflective mirrors 270 can be, for instance, water cooled, polished aluminum panels. In some embodiments, the main body of the arc lamps used in the millisecond anneal system can include reflectors for lamp radiation. For instance, FIG. 5 depicts a perspective view of both a top lamp array 220 and a bottom lamp array 240 that can be used in the millisecond anneal system 200. As shown, the main body of each lamp array 220 and 240 can include a reflector 262 for reflecting the heating light. These reflectors 262 can form a part of the reflecting surfaces of the process chamber 200 of the millisecond anneal system 80.

The temperature uniformity of the semiconductor substrate can be controlled by manipulating the light density falling onto different regions of the semiconductor substrate. In some embodiments, uniformity tuning can be accomplished by altering the reflection grade of small size reflectors to the main reflectors and/or by use of edge reflectors mounted on the wafer support plane surrounding the wafer.

Figure 6:
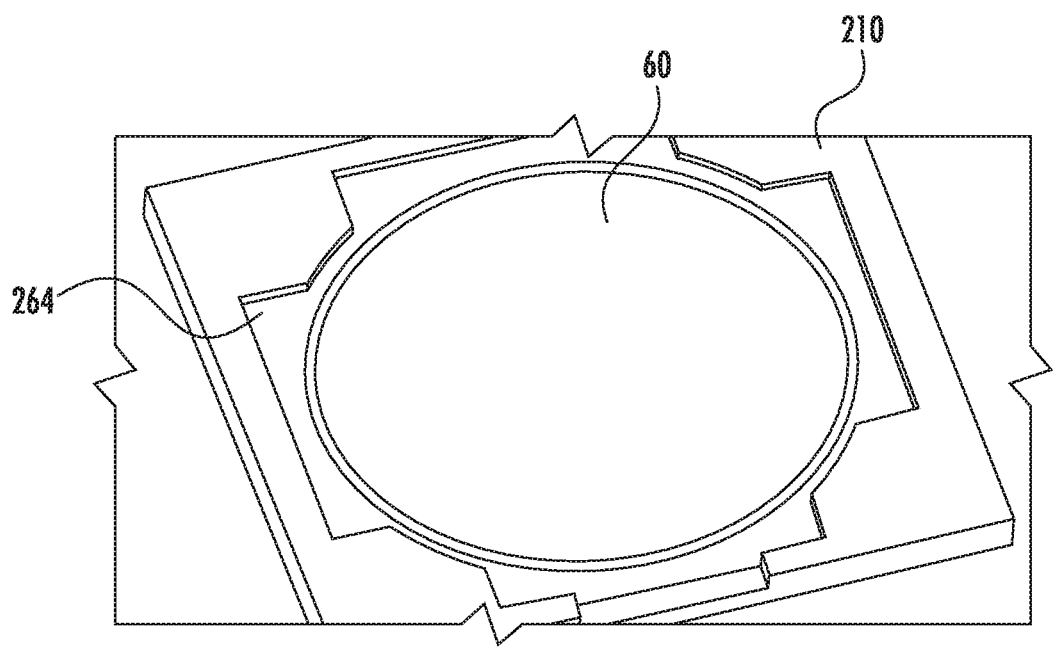
FIG. 6 depicts example lamps used in a millisecond anneal system according to example embodiments of the present disclosure.

For instance, edge reflectors can be used to redirect light from the bottom lamps 240 to an edge of the semiconductor substrate 60. As an example, FIG. 6 depicts example edge reflectors 264 that form a part of the wafer plane plate 210 that can be used to direct light from the bottom lamps 240 to the edge of the semiconductor substrate 60. The edge reflectors 264 can be mounted to the wafer plane plate 210 and can surround or at least partially surround the semiconductor substrate 60.

Figure 7:
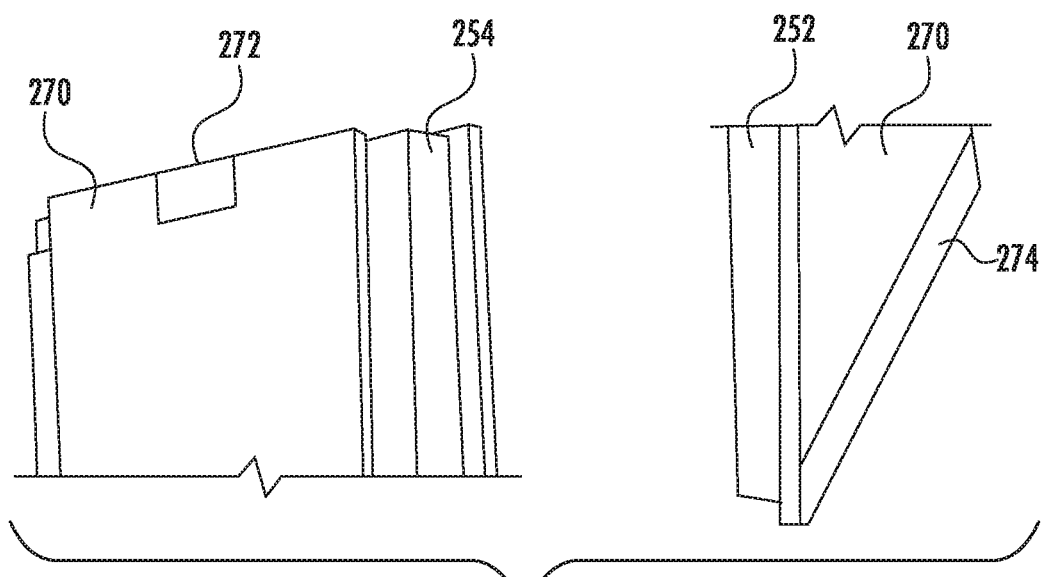
FIG. 7 depicts example edge reflectors used in a wafer plane plate of a millisecond anneal system according to example embodiments of the present disclosure.

In some embodiments, additional reflectors can also be mounted on chamber walls near the wafer plane plate 210. For example, FIG. 7 depicts example reflectors that can be mounted to the process chamber walls that can act as reflector mirrors for the heating light. More particularly, FIG. 7 shows an example wedge reflector 272 mounted to lower chamber wall 254. FIG. 7 also illustrates a reflective element 274 mounted to reflector 270 of an upper chamber wall 252. Uniformity of processing of the semiconductor substrate 60 can be tuned by changing the reflection grade of the wedge reflectors 272 and/or other reflective elements (e.g., reflective element 274) in the processing chamber 200.

Figure 8:
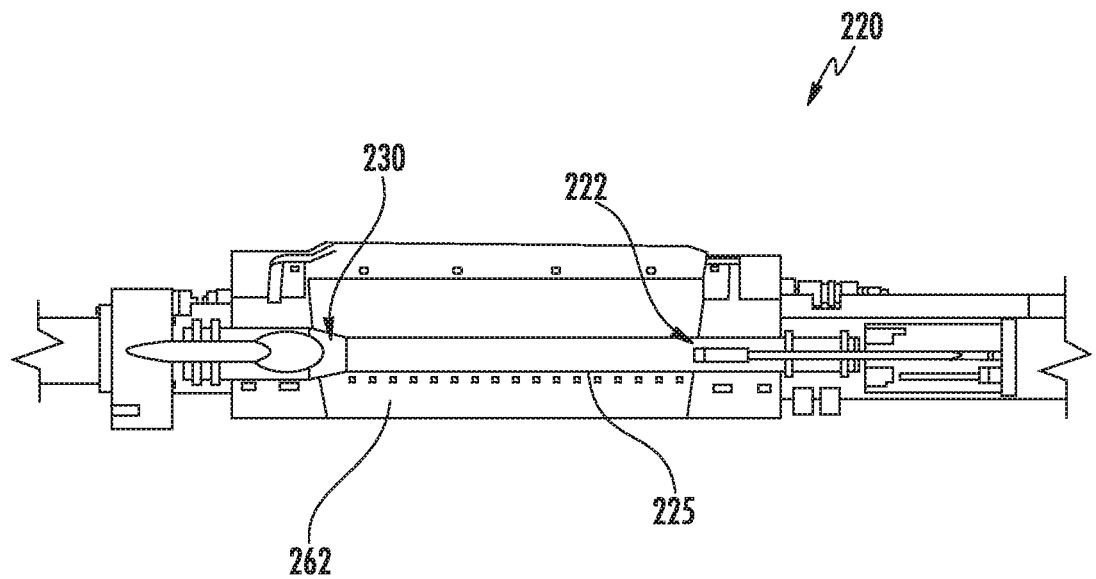
FIG. 8 depicts example wedge reflectors that can be used in a millisecond anneal system according to example embodiments of the present disclosure.
Figure 9:
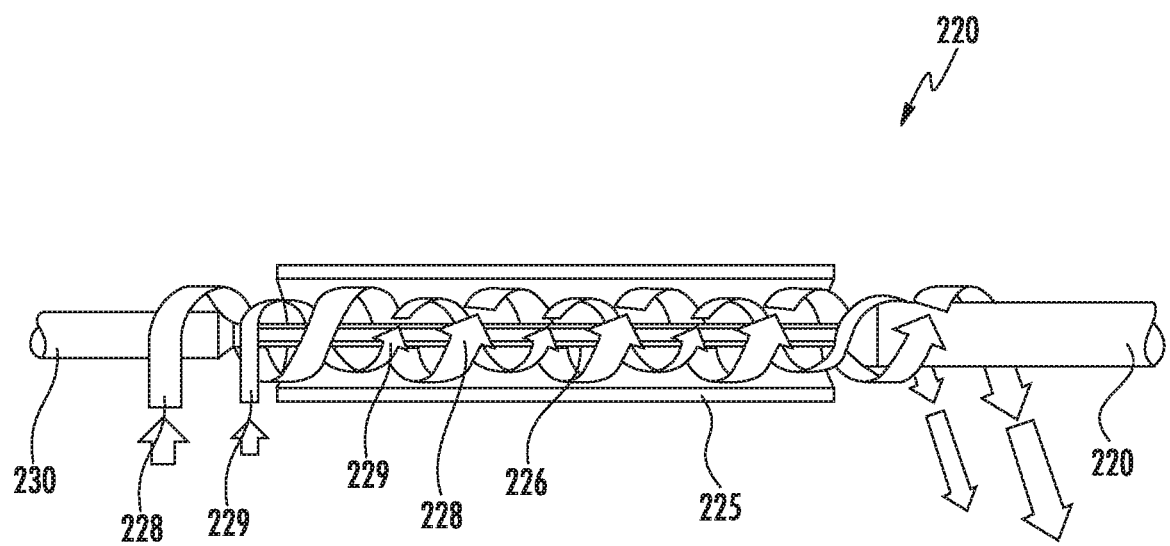
FIG. 9 depicts an example arc lamp that can be used in a millisecond anneal system according to example embodiments of the present disclosure.

FIGS. 8-11 depict aspects of example upper arc lamps 220 that can be used as light sources for intense millisecond long exposure of the top surface of the semiconductor substrate 60 (e.g., the "flash"). For instance, FIG. 8 depicts a cross-sectional view of an example arc lamp 220. The arc lamp 220 can be, for instance, an open flow arc lamp, where pressurized Argon gas (or other suitable gas) is converted into a high pressure plasma during an arc discharge. The arc discharge takes place in a quartz tube 225 between a negatively charged cathode 222 and a spaced apart positively charged anode 230 (e.g., spaced about 300 mm apart). As soon as the voltage between the cathode 222 and the anode 230 reaches a breakdown voltage of Argon (e.g., about 30 kV) or other suitable gas, a stable, low inductive plasma is formed which emits light in the visible and UV range of the electromagnetic spectrum. As shown in FIG. 9, the lamp can include a lamp reflector 262 that can be used to reflect light provided by the lamp for processing of the semiconductor substrate 60.

Figure 10:
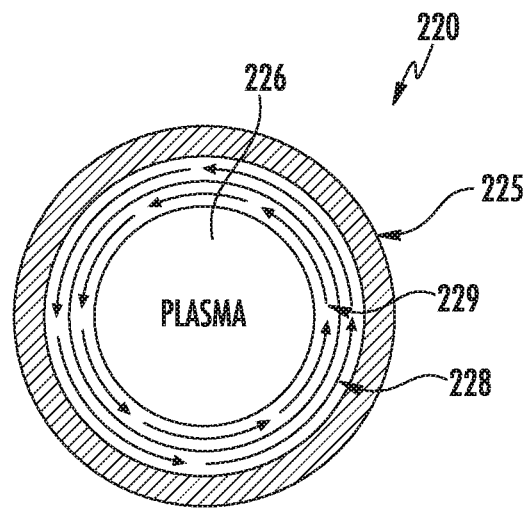
FIGS. 10-11 depict the operation of an example arc lamp according to example embodiments of the present disclosure.
Figure 11:
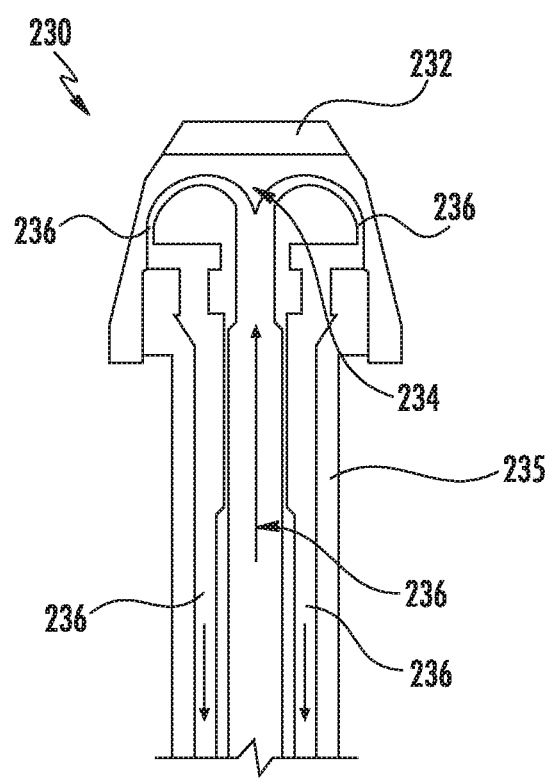

FIGS. 10 and 11 depict aspects of example operation of an arc lamp 220 in millisecond anneal system 80 according to example embodiments of the present disclosure. More particularly, a plasma 226 is contained within a quartz tube 225 which is water cooled from the inside by a water wall 228. The water wall 228 is injected at high flow rates on the cathode end of the lamp 200 and exhausted at the anode end. The same is true for the Argon gas 229, which is also entering the lamp 220 at the cathode end and exhausted from the anode end. The water forming the water wall 228 is injected perpendicular to the lamp axis such that the centrifugal action generates a water vortex. Hence, along the center line of the lamp a channel is formed for the Argon gas 229. The Argon gas column 229 is rotating in the same direction as the water wall 228. Once a plasma 226 has formed, the water wall 228 is protecting the quartz tube 225 and confining the plasma 226 to the center axis. Only the water wall 228 and the electrodes (cathode 230 and anode 222) are in direct contact with the high energy plasma 226.

FIG. 11 depicts a cross sectional view of an example electrode (e.g., cathode 230) used in conjunction with an arc lamp according to example embodiments of the present disclosure. FIG. 11 depicts a cathode 230. However, a similar construction can be used for the anode 222.

In some embodiments, as the electrodes experience a high heat load, one or more of the electrodes can each include a tip 232. The tip can be made from tungsten. The tip can be coupled to and/or fused to a water cooled copper heat sink 234. The copper heat sink 234 can include at least a portion the internal cooling system of the electrodes (e.g., one or more water cooling channels 236. The electrodes can further include a brass base 235 with water cooling channels 236 to provide for the circulation of water or other fluid and the cooling of the electrodes.

The arc lamps used in example millisecond anneal systems according to aspects of the present disclosure can be an open flow system for water and Argon gas. However, for conservation reasons, both media can be circulated in a close loop system in some embodiments.

Figure 12:
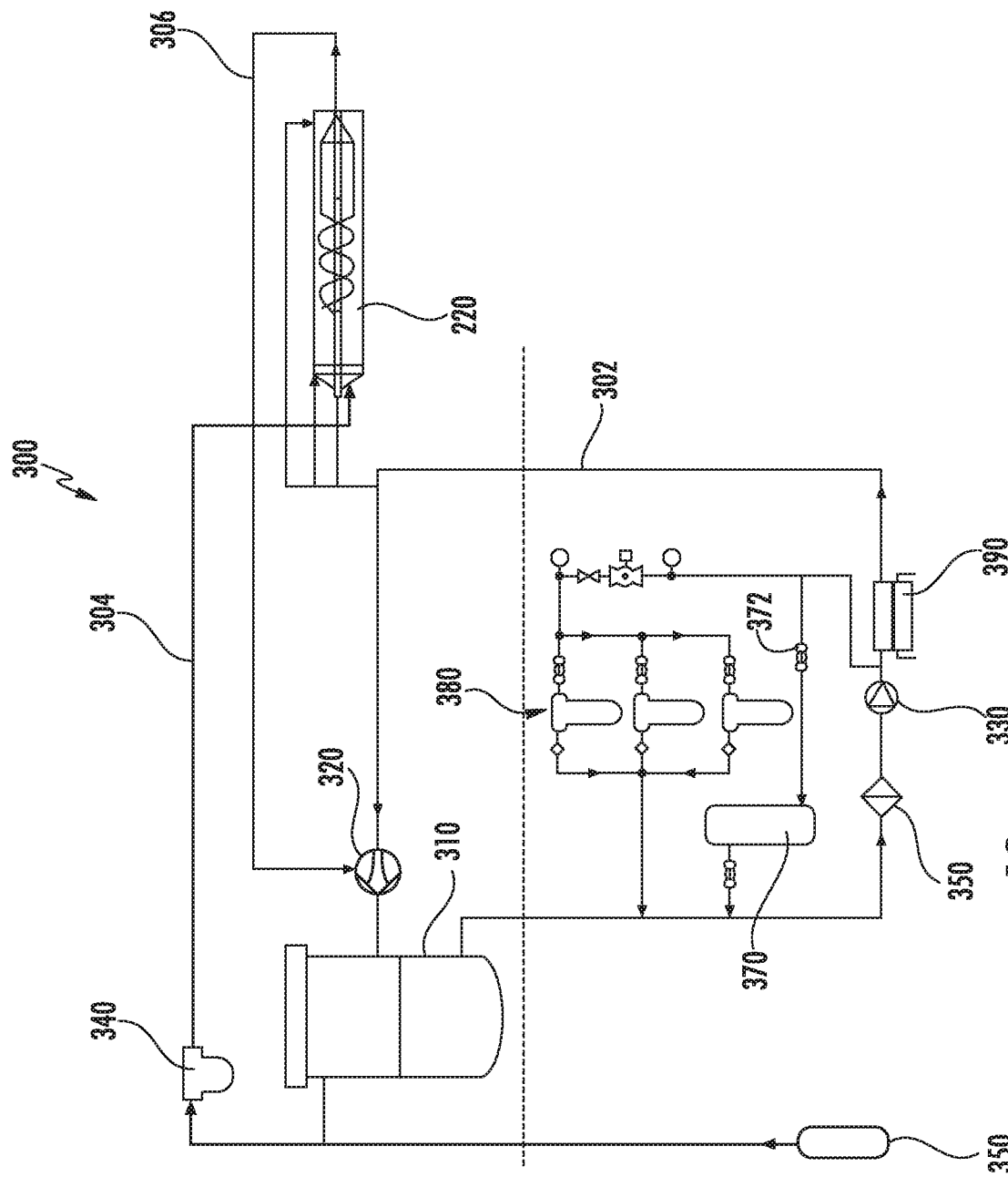
FIG. 12 depicts a cross-sectional view of an example electrode according to example embodiments of the present disclosure.

FIG. 12 depicts an example closed loop system 300 for supplying water and Argon gas needed to operate the open flow Argon arc lamps used in millisecond anneal systems according to example embodiments of the present disclosure.

More particularly, high purity water 302 and Argon 304 is fed to the lamp 220. The high purity water 302 is used for the water wall and the cooling of the electrodes. Leaving the lamp is a gas/water mixture 306. This water/gas mixture 306 is separated into gas free water 302 and dry Argon 304 by separator 310 before it can be re-fed to the inlets of the lamp 220. To generate the required pressure drop across the lamp 220, the gas/water mixture 306 is pumped by means of a water driven jet pump 320.

A high power electric pump 330 supplies the water pressure to drive the water wall in the lamp 220, the cooling water for the lamp electrodes, and the motive flow for the jet pump 320. The separator 310 downstream to the jet pump 320 can be used extracting the liquid and the gaseous phase from the mixture (Argon). Argon is further dried in a coalescing filter 340 before it re-enters the lam 220. Additional Argon can be supplied from Argon source 350 if needed.

The water is passing through one or more particle filters 350 to remove particles sputtered into the water by the arc. Ionic contaminations are removed by ion exchange resins. A portion of water is run through mixed bed ion exchange filters 370. The inlet valve 372 to the ion exchange bypass 370 can be controlled by the water resistivity. If the water resistivity drops below a lower value the valve 372 is opened, when it reaches an upper value the valve 372 is closed. The system can contain an activated carbon filter bypass loop 380 where a portion of the water can be additionally filtered to remove organic contaminations. To maintain the water temperature, the water can pass through a heat exchanger 390.

Figure 13:
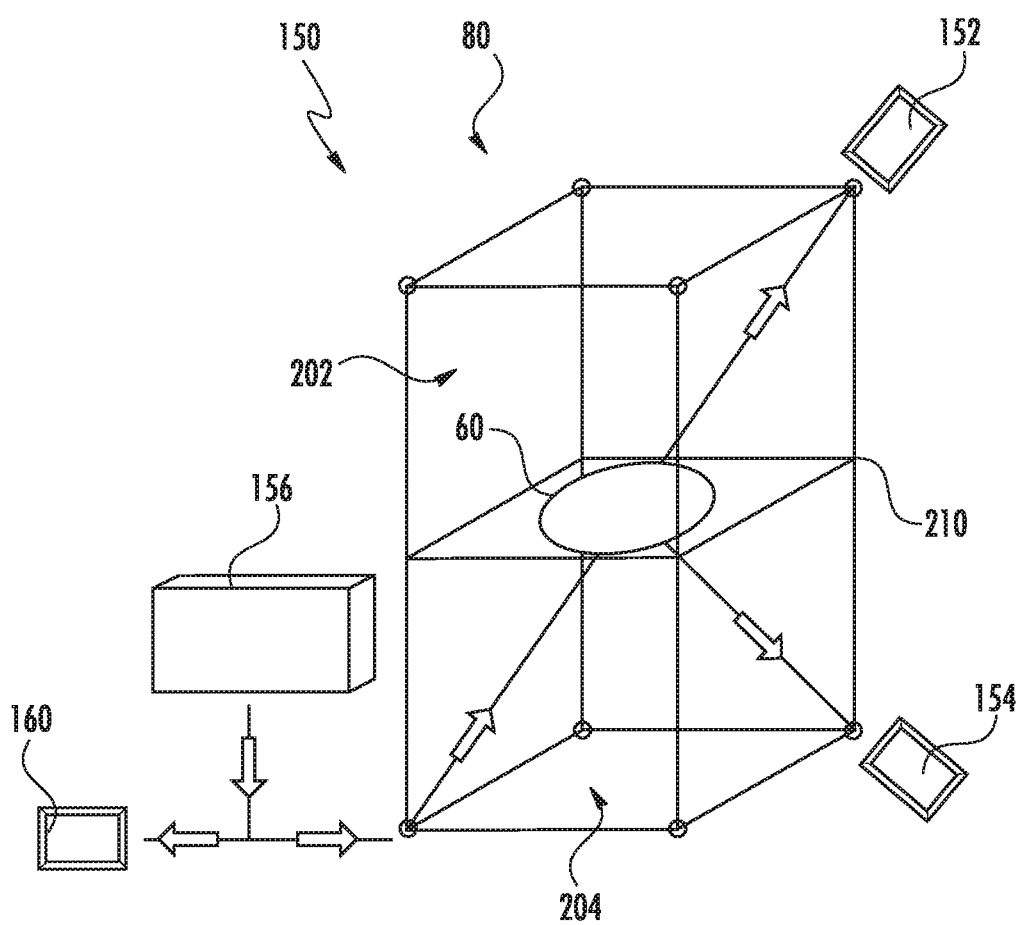
FIG. 13 depicts an example closed loop system for supplying water and argon gas to example arc lamps used in a millisecond anneal system according to example embodiments of the present disclosure.

Millisecond anneal systems according to example embodiments of the present disclosure can include the ability to independently measure temperature of both surfaces (e.g., the top and bottom surfaces) of the semiconductor substrate. FIG. 13 depicts an example temperature measurement system 150 for millisecond anneal system 200.

A simplified representation of the millisecond anneal system 200 is shown in FIG. 13. The temperature of both sides of a semiconductor substrate 60 can be measured independently by temperature sensors, such as temperature sensor 152 and temperature sensor 154. Temperature sensor 152 can measure a temperature of a top surface of the semiconductor substrate 60. Temperature sensor 154 can measure a bottom surface of the semiconductor substrate 60. In some embodiments, narrow band pyrometric sensors with a measurement wavelength of about 1400 nm can be used as temperature sensors 152 and/or 154 to measure the temperature of, for instance, a center region of the semiconductor substrate 60. In some embodiments, the temperature sensors 152 and 154 can be ultra-fast radiometers (UFR) that have a sampling rate that is high enough to resolve the millisecond temperature spike cause by the flash heating.

The readings of the temperature sensors 152 and 154 can be emissivity compensated. As shown in FIG. 13, the emissivity compensation scheme can include a diagnostic flash 156, a reference temperature sensor 158, and the temperature sensors 152 and 154 configured to measure the top and bottom surface of the semiconductor wafers. Diagnostic heating and measurements can be used with the diagnostic flash 156 (e.g., a test flash). Measurements from reference temperature sensor 158 can be used for emissivity compensation of temperature sensors 152 and 154

In some embodiments, the millisecond anneal system 200 can include water windows. The water windows can provide an optical filter that suppresses lamp radiation in the measurement band of the temperature sensors 152 and 154 so that the temperature sensors 152 and 154 only measure radiation from the semiconductor substrate.

The readings of the temperature sensors 152 and 154 can be provided to a processor circuit 160. The processor circuit 160 can be located within a housing of the millisecond anneal system 200, although alternatively, the processor circuit 160 may be located remotely from the millisecond anneal system 200. The various functions described herein may be performed by a single processor circuit if desired, or by other combinations of local and/or remote processor circuits.

Figure 16:
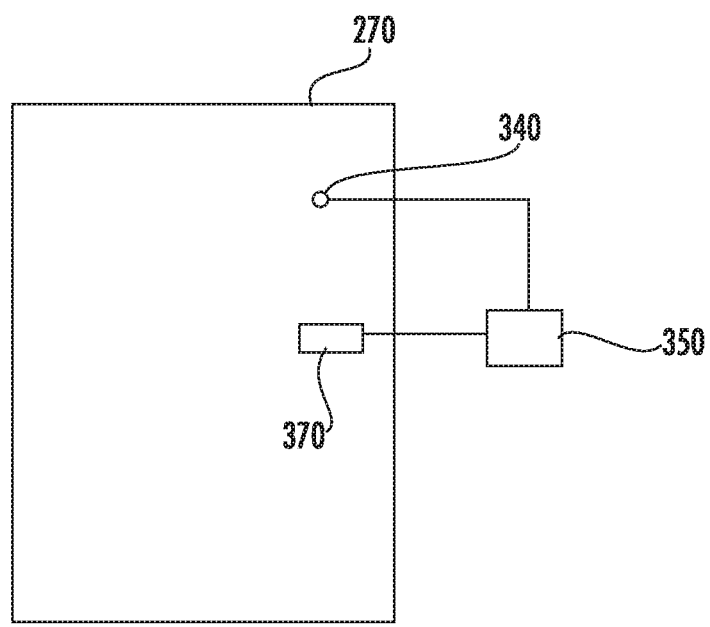

As will be discussed in detail below, the temperature measurement system can include other temperature sensors, such as a temperature sensor configured to obtain one or more temperature measurements of a wafer support plate (e.g., as shown in FIG. 16) and/or a far infrared temperature sensor (e.g., as shown in FIG. 22) configured to obtain one or more temperature measurements of a semiconductor substrate at temperatures below, for instance, about 450° C. The processor circuit 160 can be configured to process measurements obtained from the temperature sensors to determine a temperature of the semiconductor substrate and/or the wafer support plate.

Example Chamber Wall Heating in a Millisecond Anneal System

According to example embodiments of the present disclosure, the deposition of gaseous contamination products on the reflector mirrors can be reduced by heating the reflective mirrors to temperatures of 100° C. or greater, such as about 150° C. In some embodiments, a heating system can be configured to heat the reflective mirror surface to reduce contamination of the reflective mirror during millisecond anneal processing.

In some example implementation, the chamber walls can be heated by connecting a closed loop heating system to the supply and return loop of the mirror manifold of a fluid cooling system configured to flow a fluid through the reflective mirrors.

FIG. 14 depicts an example cooling system 300 for the reflective mirrors 270 and wafer plane plate 210 of an example millisecond anneal system according to example embodiments of the present disclosure. As shown the system can circulate a cooling fluid (e.g., water or other fluid) through the wafer plane plate 210 and the reflective mirrors 270 of a millisecond anneal system. The fluid can be sourced from a main fluid supply manifold 302. The fluid can be returned to a main fluid return manifold 304. The fluid can provide for temperature cooling of the wafer plane plate 210 and reflective mirrors 270 during thermal processing.

The cooling system 300 can a closed loop system for flowing fluid through the reflective mirrors 270 and/or other components of the millisecond anneal system. As shown in FIG. 3, the reflective mirrors 270 can have separate connections 312 and 314 for water in and water out for each of the chamber walls.

Referring to FIG. 14, the cooling system 300 includes a heater 320 configured to heat the fluid (e.g. water or other fluid) flowing through the cooling system. The heater 320 can be any suitable device for heating the fluid, such as an electric heater, gas heater, lamp heater, or other suitable heat source. The heater 320 can be configured to heat fluid flowing in a supply line configured to provide from the fluid supply manifold 302 to the reflective mirrors 270. The heater 320 can also be configured to heat fluid flowing in a return line configured to return fluid from the reflective mirrors 270 to the fluid return manifold 304. A closed loop system has the advantage that it can be pressurized and temperatures over about 100° C. can be reached. The reflective mirror 270 can assume the temperature of the heated fluid.

In some embodiments, the heater 320 can be coupled to one or more control devices 350 (e.g., a controller, microcontroller, processor circuit, logic device, application specific integrated circuit, etc.) configured to control operation of the heater 320 (e.g., control when the heater applies heat to the fluid flowing in the cooling system 300). In some embodiments, the one or more control devices can include one or more processors configured to execute computer-readable instructions stored in one or more memory devices. The one or more control devices 350 can be a part of a control system for a millisecond anneal system and/or can be located remote from the millisecond anneal system.

In some embodiments, the control device(s) 350 can be configured to control operation of the heater 320 based on data indicative of fluid temperature of the fluid flowing through the cooling system or based on data indicative of the temperature of one or more of the reflective mirrors 270. For instance, the heater 320 can be configured to heat the fluid flowing in the cooling system 300 until the temperature of the fluid and/or the reflective mirror 270 reaches a threshold temperature (e.g., about 150° C.). The data indicative of the fluid temperature can be received, for instance, as one or more signals from temperature sensor 320 configured to measure the temperature of the fluid. The data indicative of the temperature of the reflective mirror 270 can be received, for instance, as one or more signals from temperature sensor 340 configured to measure the temperature of the reflective mirror 270.

In some embodiments the heater can be a continuous flow heater connected in the water supply line to the mirror manifold. In this embodiment, the hot water can be dumped via the return manifold and not re-circulated.

In some embodiments, the reflective mirrors can be heated by electrical heaters in thermal communication with the reflective mirrors. For instance, the reflective mirrors can be heated by one or more electrical cartridge heaters and/or heater ribbons attached to the reflective mirrors. In these example embodiments, the reflective mirror temperature control can be accomplished by controlling the electrical current to the heaters based on temperature sensors attached to the reflective mirrors.

Figure 15:
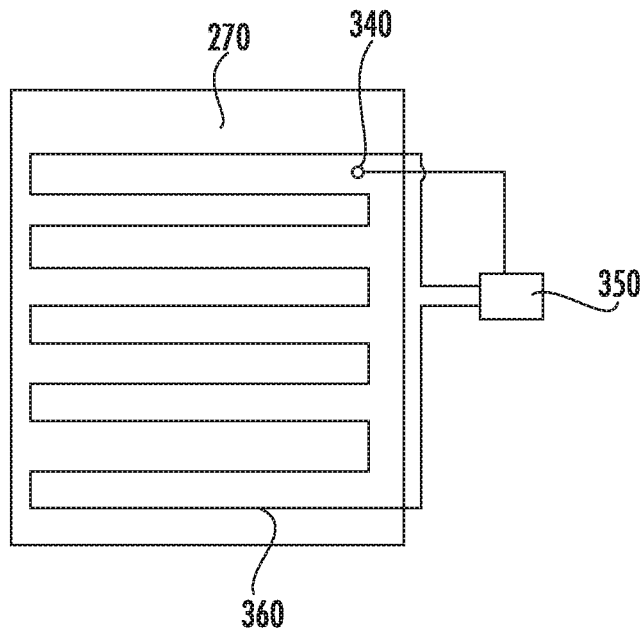
FIGS. 15 and 16 depict example electrical heaters configured to heat a reflective mirror according to example embodiments of the present disclosure.

For instance, FIG. 15 depicts an example reflective mirror 270 that can be disposed on a chamber wall of a millisecond anneal system. The reflective mirror 270 includes a heater ribbon 360 disposed on the surface of the reflective mirror 270. Electrical current through the heater ribbon 360 can be controlled by one or more control devices 350. (e.g., a controller, microcontroller, processor circuit, logic device, application specific integrated circuit, etc.). In some embodiments, the one or more control devices 350 can include one or more processors configured to execute computer-readable instructions stored in one or more memory devices. The one or more control devices 350 can be a part of a control system for a millisecond anneal system and/or can be located remote from the millisecond anneal system.

In some embodiments, the control device(s) 350 can control electrical current provided through the heater ribbon 360 based on temperature measurements from a temperature sensor 340 configured to measure temperature of the reflective mirror 270. For instance, the control device(s) 350 can provide electrical current through the heater ribbon 360 to heat the reflective mirror 270 when a temperature of the reflective mirror 270 is less than a threshold (e.g., 150° C.). The control device(s) 350 can stop providing electrical current through the heater ribbon 360 (e.g., to turn the heater ribbon 360 off) when the temperature of the reflective mirror 270 is greater than the threshold.

As another example, FIG. 16 depicts an example reflective mirror 270 that can be disposed on a chamber wall of a millisecond anneal system. The reflective mirror 270 includes a heater cartridge 370 disposed on the surface of the reflective mirror 270. Electrical current through the heater cartridge 370 can be controlled by one or more control devices 350. (e.g., a controller, microcontroller, processor circuit, logic device, application specific integrated circuit, etc.). In some embodiments, the one or more control devices 350 can include one or more processors configured to execute computer-readable instructions stored in one or more memory devices. The one or more control devices 350 can be a part of a control system for a millisecond anneal system and/or can be located remote from the millisecond anneal system.

In some embodiments, the control device(s) 350 can control electrical current provided through the heater cartridge 370 based on temperature measurements from a temperature sensor 340 configured to measure temperature of the reflective mirror 270. For instance, the control device(s) 350 can provide electrical current through the heater cartridge 370 to heat the reflective mirror 270 when a temperature of the reflective mirror 270 is less than a threshold (e.g., 150° C.). The control device(s) 350 can stop providing electrical current through the heater cartridge 370 (e.g., to turn the heater cartridge 370 off) when the temperature of the reflective mirror 270 is greater than the threshold.

In another embodiment, the chamber walls can be heated by lamp light inside the chamber. For instance, the lamp light from operation of the millisecond anneal system can heat the reflective mirrors to a threshold temperature (e.g., 150° C.). A fluid cooling system (e.g., the cooling system 300 of FIG. 14) can be controlled based on the temperature of the reflective mirror so that the reflective mirror is maintained at a temperature sufficient to reduce contamination on the surface of the mirror (e.g., 100° C. or greater).

Figure 17:
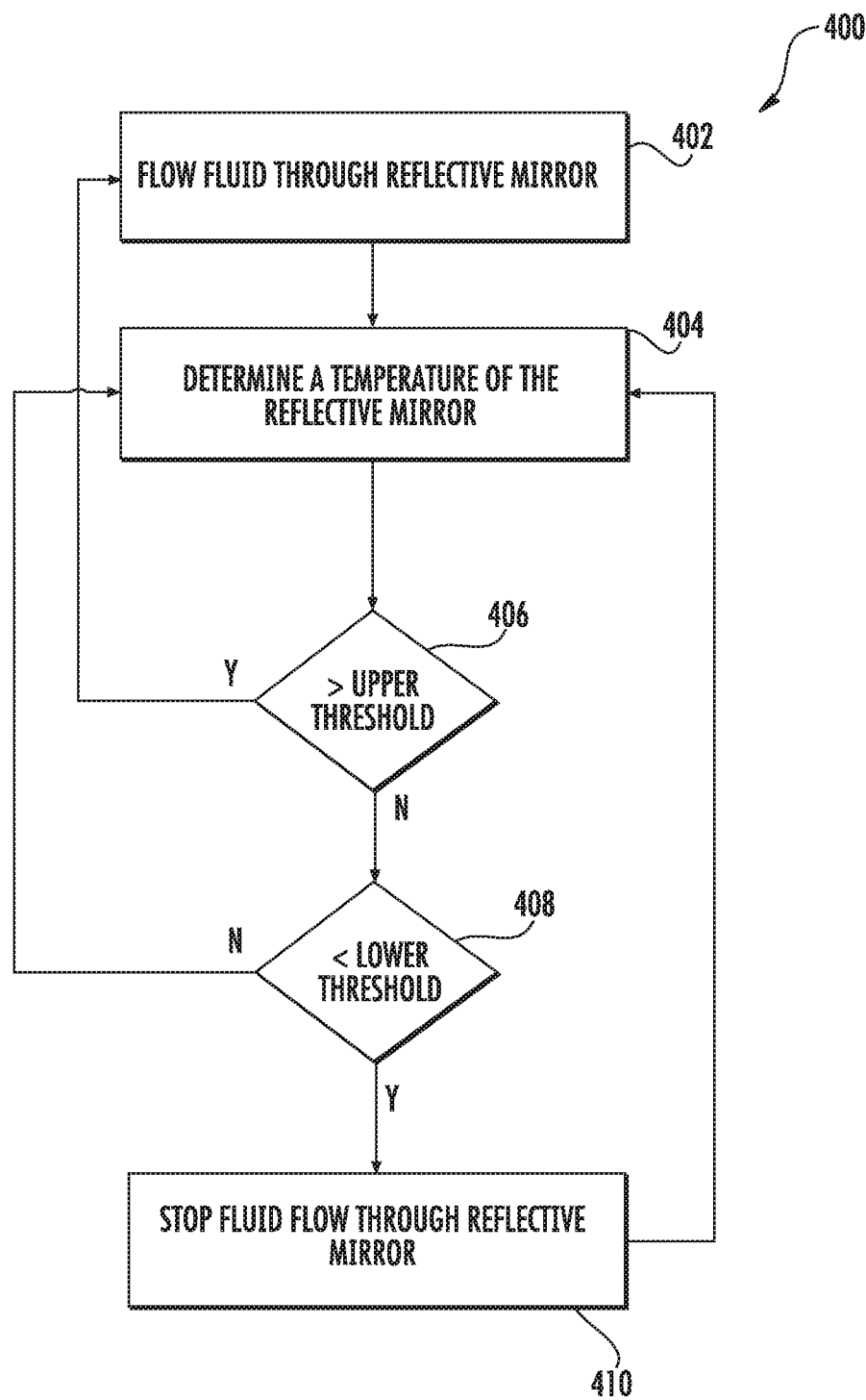
FIG. 17 depicts a flow diagram of an example process according to example embodiments of the present disclosure.

FIG. 17 depicts a flow diagram of an example process (400) for reducing contamination on a reflective mirror disposed on a chamber wall in a millisecond anneal system according to example embodiments of the present disclosure. The process (400) can be implemented using any of the example millisecond anneal systems described herein. FIG. 17 depicts steps performed in a particularly order for purposes of illustration and discussion. Those of ordinary skill in the art, using the disclosures provided herein, will understand that the various steps of any of the methods or processes described herein can be adapted, modified, rearranged, omitted, expanded, performed concurrently, or otherwise adapted in various ways without deviating from the scope of the present disclosure.

At (402), the process can include flowing a fluid (e.g., water) through a reflective mirror disposed on a chamber wall in a millisecond anneal system. For instance, a cooling system 300 can flow fluid through reflective mirror 270 in a millisecond anneal system.

At (404), a temperature of the reflective mirror can be determined. For instance, signals from a temperature sensor configured to measure a temperature of the reflective mirror can be processed to determine a temperature of the reflective mirror.

At (406), the temperature of the reflective mirror can be compared to an upper threshold. When the temperature is greater than the upper threshold, the cooling system can be controlled to flow fluid through the reflective mirror. The cooling system can either maintain current fluid flow or initial fluid flow in response to detecting that the temperature is greater than the upper threshold.

When the temperature is not greater than the upper threshold, the temperature of the reflective mirror can be compared to a lower threshold as shown at (408). When the temperature is not less than the lower threshold, the process can return to (404) and can continue to determine the temperature of the reflective mirror. When the temperature is less than the lower threshold, the process can include stopping fluid flow through the reflective mirror (410) to allow the reflective mirror to heat up during the millisecond anneal process. The process can then return to (404) and can continue to determine the temperature of the reflective mirror.

The process (400) of FIG. 17 is discussed with reference to comparing the temperature of the reflective mirror to an upper threshold and a lower threshold for example purposes. In some embodiments, the temperature can be compared to a single threshold. If the temperature is greater than the single threshold, the cooling system can be controlled to circulate fluid through the reflective mirror to cool the reflective mirror. When the temperature is less than the single threshold, the cooling system can be controlled to stop circulating fluid through the reflective mirror to allow the reflective mirror to heat up during the millisecond anneal process.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A thermal processing system for heating a substrate, comprising: a support plate configured to support the substrate in a processing chamber, the processing chamber comprising a chamber wall, the chamber wall comprising a reflective mirror; a plurality of heat sources configured to heat the substrate; a fluid cooling system configured to flow fluid into the reflective mirror; a heating system configured to heat the fluid flowing into the reflective mirror to reduce contamination evaporating from at least one surface of the substrate on the reflective mirror during a millisecond anneal thermal processing, wherein the heating system comprises one or more control devices configured to adjust a temperature of the fluid flowing into the reflective mirror based at least in part on one or more signals from a temperature sensor configured to measure the temperature of the reflective mirror.

2. The thermal processing system of claim 1, wherein the heating system is configured to heat the reflective mirror to a temperature of about 100° C. or greater.

3. The thermal processing system of claim 1, wherein the heating system is capable of heating the reflective mirror to a temperature of about 150° C.

4. The thermal processing system of claim 1, wherein the heating system comprises a heater configured to heat fluid flowing in a fluid supply line configured to supply fluid to the reflective mirror.

5. The thermal processing system of claim 4, wherein the heater is configured to heat fluid flowing in a fluid return line configured to receive fluid from the reflective mirror.

6. The thermal processing system of claim 4, wherein the one or more control devices are configured to control operation of the heater.

7. The thermal processing system of claim 6, wherein the one or more control devices are configured to control operation of the heater based at least in part on data indicative of fluid temperature.

8. The thermal processing system of claim 6, wherein the one or more control devices are configured to control operation of the heater based at least in part on data indicative of the temperature of the reflective mirror.

9. The thermal processing system of claim 1, wherein the one or more control devices are configured to control a flow of fluid through the fluid cooling system based at least in part on the temperature of the reflective mirror.

10. A process for reducing contamination on a reflective mirror disposed on a chamber wall in a thermal processing system that is used to heat a substrate, the process comprising:
   placing the substrate onto a support plate;
   heating the substrate;
   performing a millisecond anneal thermal process;
   flowing a fluid through a reflective mirror disposed on the chamber wall in the thermal processing system;
   determining a temperature associated with one or more of the reflective mirror or the fluid; and
   adjusting one or more characteristics of the fluid flowing through the reflective mirror based at least in part on the temperature to achieve a reflective mirror temperature sufficient to reduce contamination evaporating from at least from at least one surface of the substrate on the reflective mirror during the millisecond anneal thermal process;
   wherein adjusting one or more characteristics of the fluid flowing through the reflective mirror comprises adjusting a temperature of the fluid flowing through the reflective mirror based at least in part on one or more signals from a temperature sensor configured to measure the temperature of the reflective mirror.

11. The process of claim 10, wherein adjusting one or more characteristics of the fluid flowing through the reflective mirror comprises heating the fluid flowing through the reflective mirror.

12. The process of claim 10, wherein the fluid is heated using a heater configured to heat fluid flowing in a fluid supply line configured to supply fluid to the reflective mirror.

13. The process of claim 12, wherein the heater is configured to heat fluid flowing in a fluid return line configured to receive fluid from the reflective mirror.

14. The process of claim 10, wherein adjusting one or more characteristics of the fluid flowing through the reflective mirror comprises adjusting a flow of the fluid through the reflective mirror.

15. The process of claim 14, wherein adjusting the flow of the fluid through the reflective mirror comprises:
   switching on the flow of fluid when the temperature associated with the reflective mirror is greater than an upper threshold; and
   switching off the flow of fluid when the temperature associated with the reflective mirror is less than a lower threshold.

* * * * *